United States Patent
Wakuda

(10) Patent No.: US 9,983,741 B2
(45) Date of Patent: May 29, 2018

(54) CAPACITIVE INPUT DEVICE

(71) Applicant: ALPS ELECTRIC CO., LTD., Tokyo (JP)

(72) Inventor: Hiroshi Wakuda, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 196 days.

(21) Appl. No.: 14/595,004

(22) Filed: Jan. 12, 2015

(65) Prior Publication Data

US 2015/0248180 A1 Sep. 3, 2015

(30) Foreign Application Priority Data

Mar. 3, 2014 (JP) ................................ 2014-040891

(51) Int. Cl.
*G06F 3/044* (2006.01)
*G06F 3/041* (2006.01)

(52) U.S. Cl.
CPC ............ *G06F 3/044* (2013.01); *G06F 3/0416* (2013.01); *G06F 2203/04101* (2013.01); *H03K 2217/960745* (2013.01); *H03K 2217/960755* (2013.01)

(58) Field of Classification Search
CPC ... G06F 3/0416; G06F 3/0412; G02F 1/13338
See application file for complete search history.

(56) References Cited

U.S. PATENT DOCUMENTS

| | | | |
|---|---|---|---|
| 2002/0154039 A1 | 10/2002 | Lambert et al. | |
| 2008/0174321 A1* | 7/2008 | Kang | G06F 3/044 324/686 |
| 2009/0309851 A1* | 12/2009 | Bernstein | G06F 3/0416 345/174 |
| 2010/0079283 A1* | 4/2010 | Hammerschmidt | H03K 17/955 340/562 |
| 2011/0084929 A1* | 4/2011 | Chang | G06F 3/0416 345/173 |
| 2011/0267310 A1* | 11/2011 | Tsukahara | G06F 3/0416 345/174 |
| 2011/0279410 A1* | 11/2011 | Han | G06F 3/044 345/174 |
| 2011/0298735 A1* | 12/2011 | Kamaeguchi | G06F 3/0416 345/173 |

(Continued)

FOREIGN PATENT DOCUMENTS

| CN | 102576276 | 7/2012 |
|---|---|---|
| JP | 2011-253396 | 12/2011 |

(Continued)

*Primary Examiner* — Kent Chang
*Assistant Examiner* — Sujit Shah
(74) *Attorney, Agent, or Firm* — Beyer Law Group LLP

(57) ABSTRACT

Electrode portions located on both ends are set to detection electrode portions, ground electrode portions are set on the inside thereof, and a plurality of central electrode portions are set to driving detection portions. A coordinate position of a finger can be obtained based on an output difference between the detection electrode portions, and a vertical distance can be obtained based on an output sum. When the vertical distance of the finger is shorter than a first threshold, switching is performed so that an interval between the detection electrode portions is shortened, and when the finger approaches, a touch detection mode is set.

6 Claims, 6 Drawing Sheets

(56) References Cited

U.S. PATENT DOCUMENTS

| | | | | |
|---|---|---|---|---|
| 2012/0044199 A1* | 2/2012 | Karpin | ............... | G06F 3/0416 |
| | | | | 345/174 |
| 2012/0050180 A1* | 3/2012 | King | ............... | G06F 3/0416 |
| | | | | 345/173 |
| 2012/0133614 A1* | 5/2012 | Bytheway | ............... | G06F 3/044 |
| | | | | 345/174 |
| 2015/0160819 A1* | 6/2015 | Hwang | ............... | G06F 3/04817 |
| | | | | 715/769 |

FOREIGN PATENT DOCUMENTS

| | | |
|---|---|---|
| JP | 2012-22635 | 2/2012 |
| JP | 2013-80290 | 5/2013 |
| WO | 2012/027003 | 3/2012 |

\* cited by examiner

CAPACITIVE INPUT DEVICE

CLAIM OF PRIORITY

This application claims benefit of Japanese Patent Application No. 2014-040891 filed on Mar. 3, 2014, which is hereby incorporated by reference.

BACKGROUND OF THE INVENTION

1. Field of the Invention

The present invention relates to a capacitive input device that detects a position of an operation body such as a finger or a hand located in front of an electrode group having a plurality of electrode portions.

2. Description of the Related Art

Japanese Unexamined Patent Application Publication No. 2013-80290 discloses an invention of a touch sensor that enables so-called hover detection. The hover detection is also called hovering detection and refers to a detection operation of detecting presence of a finger or a hand in a position away from an operation surface of a touch sensor and a position thereof.

The touch sensor described in Japanese Unexamined Patent Application Publication No. 2013-80290 selects three lines of a plurality of lines arranged side by side, sets one line to a detection line, and sets the lines on both sides of the detection line to driving lines. In a detection operation, an approach state of a finger or the like is detected by obtaining a difference between capacitance between the detection line and the driving line located on one side and capacitance between the detection line and the driving line located on the other side. Further, a position on a coordinate of the approaching finger is detected by sequentially switching selection positions of the three lines.

The touch sensor described in Japanese Unexamined Patent Application Publication No. 2013-80290 performs an operation of sequentially switching combinations of the detection line and the driving lines, which include three lines, in a plurality of X lines and a plurality of Y lines.

In this configuration, when a hover detection distance that is a distance at which the finger or the hand can be detected from the operation surface is lengthened, capacitive coupling between a central detection line and the driving lines on both sides thereof should be larger in comparison with capacitance between the finger or the hand and the detection line, and an S/N ratio is easily degraded when approach of the finger or the hand is detected. Further, since an operation of sequentially switching the combination between the detection line and the driving line to all of the X lines and all the Y lines is performed, the number of times the lines are switched increases and a burden on a control circuit increases.

SUMMARY OF THE INVENTION

The present invention is intended to solve the above-described problems, and provides a capacitive input device capable of detecting an approach position of an operation body such as a finger with high precision without increasing a circuit burden.

According to the present invention, there is provided a capacitive input device including a first electrode group including a plurality of electrode portions arranged at intervals in a first direction and continuous in a second direction orthogonal to the first direction, a driving circuit that supplies driving power to any of the electrode portions, and a detection circuit that detects outputs from the electrode portions, in which a plurality of electrode portions among the electrode portions constituting the first electrode group operate as driving electrode portions to which the driving power is supplied, and the electrode portions located on both sides of the driving electrode portions operate as detection electrode portions that detect the outputs.

In the capacitive input device of the present invention, preferably, a plurality of adjacent electrode portions are set to the driving electrodes and electrode portions located on both sides thereof are set to the detection electrode portions, such that two detection electrode portions can be maintained at an appropriate distance and an approach state or an approach position of the operation body can be detected with a good S/N ratio. Further, since the approach position can be detected based on a plurality of differences or ratios between the outputs from the two detection electrode portions, it is not necessary to frequently switch the driving electrode portions and the detection electrode portions and it is possible to reduce a circuit burden.

In the present invention, a ground electrode portion set to a ground potential is preferably provided between the driving electrode portion and each detection electrode portion.

It is possible to improve linearity of a detection output of a movement position when the operation body moves in the first direction by providing the ground electrode portions.

In the present invention, a position in the first direction of an operation body approaching the first electrode group may be calculated from a difference or a ratio between outputs of the detection electrode portion located on one side and the detection electrode portion located on the other side, the driving electrode portion being interposed between the detection electrode portions.

In the present invention, a distance from the first electrode group to the operation body may be calculated from a sum of outputs of the detection electrode portion located on the one side and the detection electrode portion located on the other side, the driving electrode portion being interposed between the detection electrode portions.

In the present invention, control of changing display content of a display screen according to the distance may be performed.

In the present invention, a substrate with a light transmission characteristic may be provided in front of the display screen, and the first electrode group may be provided on the substrate.

In the present invention, when the distance is shorter than an approach detection distance set in advance, switching is preferably performed so that electrode portions located at a distance shorter than a first set distance in the first direction of the detection electrode portions become new detection electrode portions.

It is possible to detect the approach distance of the operation body with higher precision by performing the switching operation.

In the present invention, a second electrode group including a plurality of electrode portions arranged at intervals in a second direction and continuous in the first direction may be provided, capacitance may be formed between the electrode portions constituting the first electrode group and the electrode portions constituting the second electrode group, and when a distance from the first electrode group and the second electrode group to the operation body is shorter than a shortest detection distance set in advance, switching to a touch detection mode in which driving power is sequentially supplied to one of the first electrode group and the second electrode group and detection output is obtained from the other electrode group may be performed.

In the present invention, the detection electrode portions are arranged on both sides of the plurality of driving electrode portions, such that an approach state and an approach position of the operation body that has approached the front of the electrode groups can be detected with high precision. Further, since the approach position is calculated from the detection outputs of two detection electrode portions, it is not necessary to frequently switch selection positions of the driving electrode portions and the detection electrode portions and it is possible to reduce a circuit burden.

DESCRIPTION OF THE PREFERRED EMBODIMENTS

Structure of Capacitive Input Device

Figure 1:
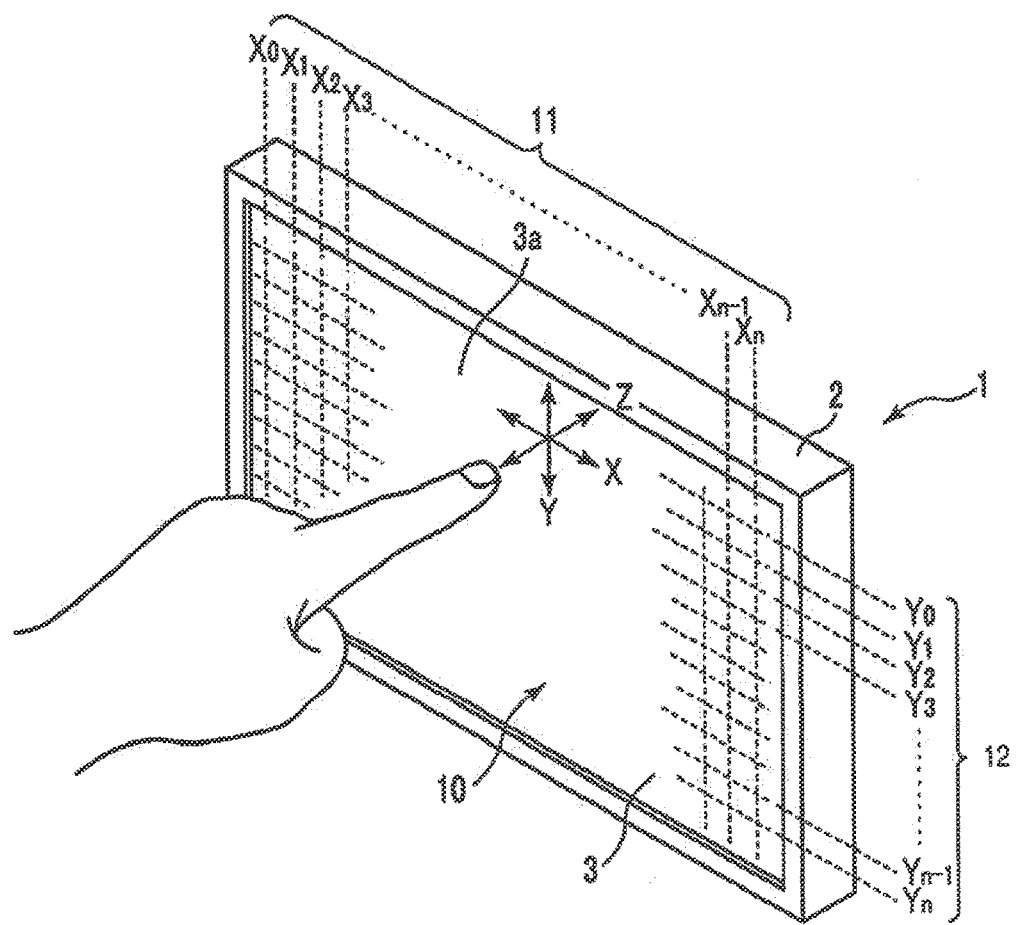
FIG. 1 is a perspective view illustrating an operation state of a capacitive input device of an embodiment of the present invention.

In a display input device 1 illustrated in FIG. 1, a display device 3 such as a color liquid crystal display panel is provided inside a housing 2, and a capacitive input device 10 with a light transmission characteristic is arranged in front of the display device 3.

When the display input device 1 is used for a vehicle, car navigation information, audio system information, radio reception information, road information, setting information of an air conditioner, or other information on driving or facility of the vehicle is displayed on a display screen 3a of the display device 3.

Figure 2:
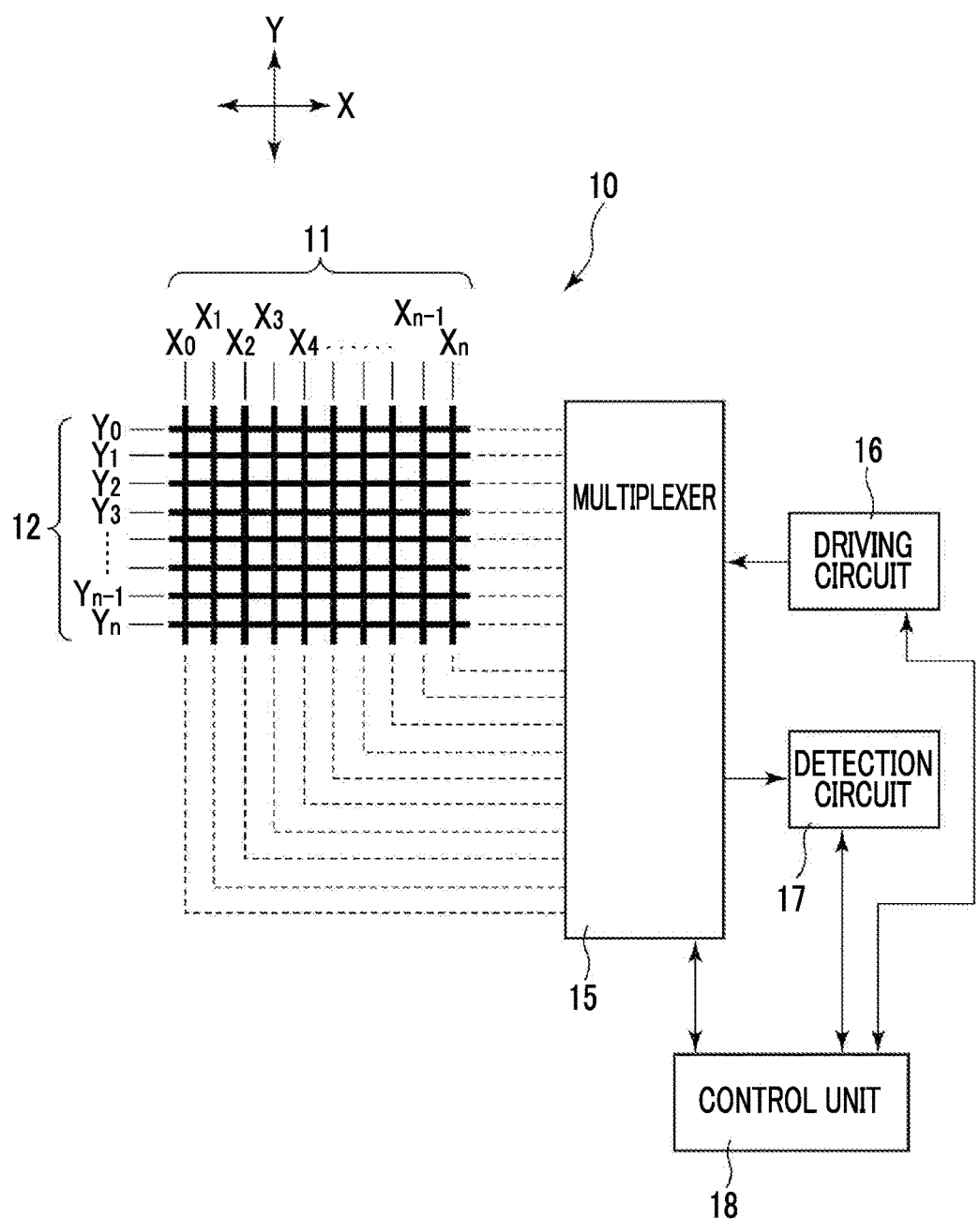
FIG. 2 is a circuit block diagram of the capacitive input device of the embodiment of the present invention.

In the capacitive input device 10 illustrated in FIGS. 1 and 2, an X direction is a first direction, a Y direction is a second direction, and a Z direction is a front and back direction (approaching and separating direction).

Figure 3:
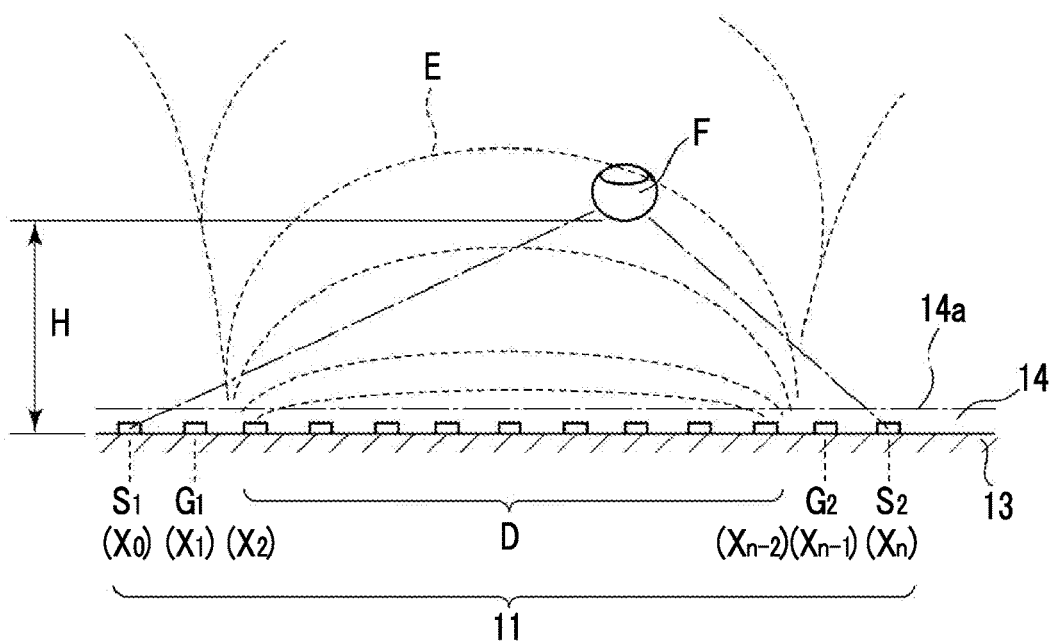
FIG. 3 is an illustrative diagram illustrating a detection operation of the capacitive input device of the embodiment of the present invention.
Figure 3:
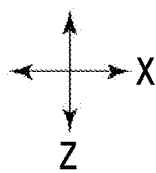

A first electrode group 11 and a second electrode group 12 are provided in the capacitive input device 10. In FIG. 3, a cross-section of the first electrode group 11 is shown. In the capacitive input device 10, a substrate 13 with a light transmission characteristic is arranged in front of the display device 3. This substrate 13 is formed of a resin sheet such as a PET, an acrylic plate, or the like. The substrate 13 has a surface which is parallel to an X-Y plane, and the first electrode group 11 and the second electrode group 12 are formed on this surface. The first electrode group 11 and the second electrode group 12 are formed of a conductive material with a light transmission characteristic, such as an ITO.

A plurality of electrode portions constituting the first electrode group 11 are illustrated by $X_0, X_1, X_2, X_3, \ldots, X_n$, as illustrated in FIGS. 1 and 2. The electrode portions constituting the first electrode group 11 are arranged with a constant pitch in the X direction that is the first direction. The respective electrode portions continuously extend in the Y direction that is the second direction. A plurality of electrode portions constituting the second electrode group 12 are illustrated by $Y_0, Y_1, Y_2, Y_3, \ldots, Y_n$. The electrode portions constituting the second electrode group 12 are arranged with a constant pitch in the Y direction that is the second direction. The respective electrode portions continuously extend in the X direction that is the first direction.

Each electrode portion constituting the first electrode group 11 and each electrode portion constituting the second electrode group 12 intersect on the surface of the substrate 13, but each electrode portion constituting the first electrode group 11 and each electrode portion constituting the second electrode group 12 are insulated from each other in an intersection portion.

As illustrated in FIG. 3, the front of the first electrode group 11 and the second electrode group 12 is covered with a cover member 14 with a light transmission characteristic. The cover member 14 is an acrylic plate or a polycarbonate plate, and a surface thereof is an operation surface 14a.

In the embodiment illustrated in FIGS. 1 and 2, the electrode portions $X_0, X_1, X_2, X_3, \ldots, X_n$ constituting the first electrode group 11 have a band shape that is continuous in the Y direction, and the electrode portions $Y_0, Y_1, Y_2, Y_3, \ldots, Y_n$ constituting the second electrode group 12 have a band shape that is continuous in the X direction. However, the electrode portions constituting the first electrode group 11 may be portions in which electrode patterns having a constant area, such as a square, form columns with a constant pitch in the Y direction and the electrode patterns in each column are conducted. Similarly, the electrode portions constituting the second electrode group 12 may be portions in which electrode patterns having a constant area, such as a square, form columns with a constant pitch in the X direction and the electrode patterns in each column are conducted.

As illustrated in FIG. 2, in the capacitive input device 10, a multiplexer 15 that is a switching circuit, a driving circuit 16, and a detection circuit 17 are provided. Each of the circuits is controlled by a control unit 18.

The electrode portions $X_0, X_1, X_2, X_3, \ldots, X_n$ constituting the first electrode group 11 and the electrode portions $Y_0, Y_1, Y_2, Y_3, \ldots, Y_n$ constituting the second electrode group 12 are switched by the multiplexer 15 and connected to the driving circuit 16 or the detection circuit 17.

Operation

Next, an operation of the capacitive input device 10 will be described.

In this capacitive input device 10, an input operation is performed by causing an operation body set to a ground potential to approach the operation surface 14a and further come into contact with the operation surface 14a. In the following embodiment, a finger F of a person is used as the operation body. However, a palm or the like may be used as the operation body or a metal body or the like other than a hand of the person may be used as the operation body.

An operation mode of the capacitive input device 10 is switched to a hover detection mode and a touch detection mode in the control unit 18. The hover detection mode refers to a mode in which the finger F is caused to approach the substrate 13 in a position away from the operation surface 14a illustrated in FIG. 3 to perform an input operation or the finger F is caused to move parallel to an X-Y plane in a position away from the operation surface 14a to perform an input operation.

The touch detection mode refers to a mode in which the finger F is caused to come into contact with the operation surface 14a or to approach the operation surface 14a, for example, within a short distance of 5 mm or less to perform the input operation. Hover detection mode When this capacitive input device 10 starts up, an initial mode is set, and a state in which hover detection is possible is automatically set. An operation state of the first electrode group when the initial mode is set is illustrated in FIG. 3.

As illustrated in FIG. 3, in the initial mode, through switching of the multiplexer 15, the electrode portion $X_0$ located at a left end in an X direction that is a first direction is set to the detection electrode portion S1, and the electrode portion $X_n$ located at a right end in the X direction is set to the detection electrode portion S2. The plurality of electrode portions from a third electrode portion $X_2$ on the left side to a third electrode portion $X_{n-2}$ on the right side are all set to the driving electrode portion D through switching of the multiplexer 15. Also, the electrode portion X1 located between the electrode portion $X_0$ set to the detection electrode portion S1 and the electrode portion $X_2$ set to the driving electrode portion D is set to a ground electrode portion G1 set to the ground potential by the multiplexer 15. Further, the electrode portion $X_{n-1}$ located between the electrode portion Xn set to the detection electrode portion S2 and the electrode portion Xn−2 set to the driving electrode portion D is set to a ground electrode portion G2 set to the ground potential by the multiplexer 15.

In the driving circuit 16, driving power including pulsed voltages of a square wave at certain intervals is generated, and simultaneously applied to the plurality of driving electrode portions D. That is, the driving power at a constant frequency is applied to all of the plurality of driving electrode portions D with the same phase.

As illustrated in FIG. 3, an electric field area E is formed in front of the substrate 13 when the pulsed voltage is applied to all the driving electrode portions D. Since capacitance is formed between all the driving electrode portions D and the detection electrode portion S1 and capacitance is formed between all the driving electrode portions D and the detection electrode portion S2, an instantaneous detection current flows through the detection electrode portions S1 and S2 at the time of rising and falling of the pulsed voltage applied to the driving electrode portions D. This detection current is applied to the detection circuit 17.

When the finger F is caused to face the front of the operation surface 14a, relatively large capacitance is formed between the finger F and the plurality of driving electrode portions D, as illustrated in FIG. 3. As a result, a detection current flowing through the detection electrode portions S1 and S2 changes. Whenever the pulsed driving power is applied to the driving electrode portions D, the detection current obtained in the detection electrode portions S1 and S2 is converted into a voltage, integrated, amplified, and A/D-converted by the detection circuit 17, and applied to the control unit 18 as a detection output.

In the control unit 18, a difference (Os1−Os2) between a detection output Os1 from the detection electrode portion S1 and a detection output Os2 from the detection electrode portion S2 is obtained. Through this calculation, a coordinate position in the first direction (X direction) of the finger F approaching the capacitive input device 10 can be measured. Alternatively, the coordinate position of the finger F can be detected from a ratio of the detection output Os1 and the detection output Os2.

Figure 4A:
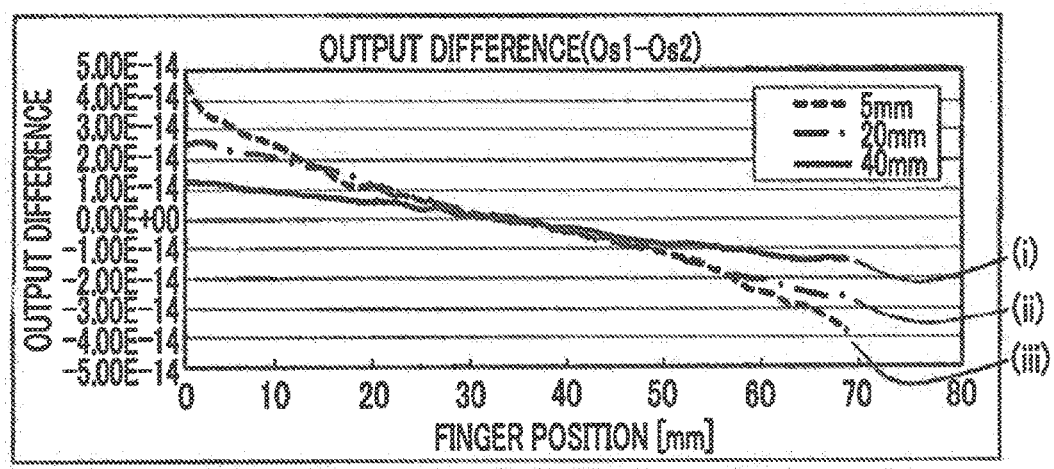
FIG. 4A is a diagram illustrating a difference between detection outputs from detection electrode portions on both sides.

In a diagram illustrated in FIG. 4A, a position on an X coordinate of the finger F is shown in a horizontal axis, and the output difference (Os1−Os2) is shown in a vertical axis. FIG. 4A shows a simulation result, and the capacitive input device 10 that is a simulation target has about 70 mm as a dimension in the X direction. In the simulation, the number n of electrode portions in the first electrode group was 8. Further, the driving voltage was 3.3 V and capacitance in DC coupling was evaluated.

In FIG. 4A, a line when a vertical distance H in a Z direction from the surface of the substrate 13 to a lower surface of the finger F is changed is illustrated. The vertical distance H is 40 mm in (i), 20 mm in (ii), and 5 mm in (iii). Since the electrode portions constituting the first electrode group 11 are formed to be thin, the vertical distance H is substantially the same as the vertical distance from the surface of the electrode portion to the lower surface of the finger F.

It can be seen that the position when the finger F is moved in the first direction (X direction) is identified from the output difference (Os1−Os2) even when the vertical distance H is a distance of any one of 40 mm, 20 mm, and 5 mm, as illustrated in FIG. 4A. In this embodiment, the ground electrode portion G1 is arranged between the driving electrode portion D and the detection electrode portion S1, and the ground electrode portion G2 is arranged between the driving electrode portion D and the detection electrode portion S2, as illustrated in FIG. 3. Therefore, it is possible to prevent capacitive coupling between the plurality of driving electrode portions D and the respective detection electrode portions S1 and S2 from being excessive, and to improve linearity of the output difference (Os1−Os2) when the finger F is moved to a left portion or a right portion in the X direction.

Further, in the control unit 18, an output sum (Os1+Os2) is obtained from the detection output Os1 from the detection electrode portion S1 and the detection output Os2 from the detection electrode portion S2. The vertical distance H in the Z direction from the surface of the substrate 13 (the surface of the electrode portion) to the lower surface of the finger F can be measured by calculating this output sum (Os1+Os2).

Figure 4B:
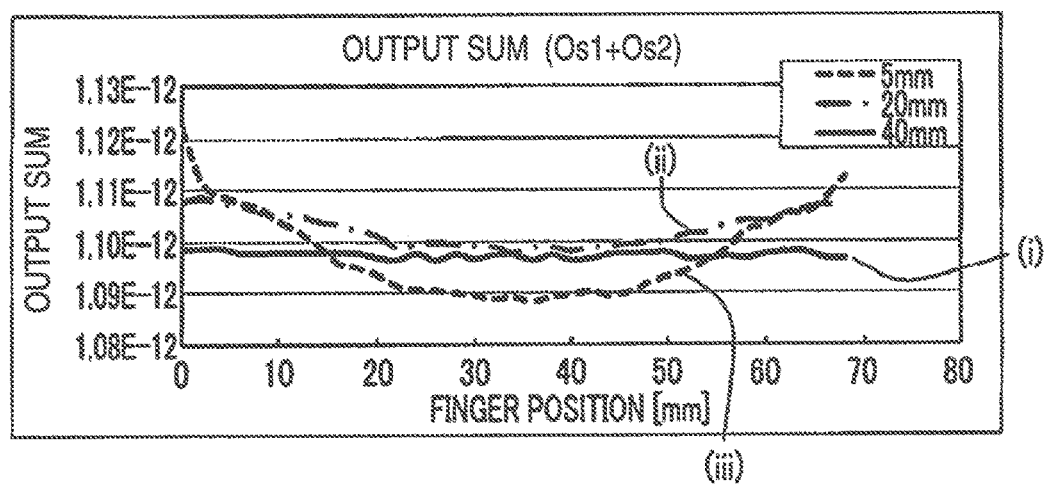
FIG. 4B is a diagram illustrating a sum of the detection outputs from the detection electrode portions on both sides.

FIG. 4B illustrates a simulation result under the same conditions as in FIG. 4A. A horizontal axis of FIG. 4B indicates the position on the X coordinate of the finger F, and a vertical axis indicates the output sum (Os1+Os2) when the finger is in each position. In FIG. 4B, the vertical distance H is 40 mm in (i), 20 mm in (ii), and 5 mm in (iii), as in FIG. 4A.

When the vertical distance H is 40 mm, the output sum (Os1+Os2) is substantially constant even when the finger F is in any position in the X direction, as illustrated in FIG. 4B. When the vertical distance H becomes 20 mm, the output sum (Os1+Os2) when the finger F reaches a central portion in the X direction begins to decrease. When the vertical distance H becomes 5 mm, the output sum (Os1+Os2) when the finger F moves to the central portion in the X direction further decreases.

When an operation is performed to cause the finger F to approach the operation surface 14a in the central portion in the X direction, the output sum (Os1+Os2) is increased as the vertical distance H is shortened in a process in which the finger F is caused to approach from a position away in the front to about 20 mm, and accordingly, the vertical distance H can be measured. However, when the finger F is caused to further approach the operation surface 14a and the vertical distance H becomes shorter than 20 mm, a reversal phenomenon that the output sum (Os1+Os2) is decreased as the finger F approaches the operation surface 14a occurs. Therefore, it cannot be identified whether the finger F approaches the operation surface 14a or moves away from the operation surface 14a.

This is because a width in the X direction of the capacitive input device 10 is large, an interval in the X direction between the detection electrode portion S1 and S2 is set to be wide, and thus, detection sensitivity of the detection electrode portions S1 and S2 is degraded when the finger F approaches the driving electrode portion D in a central portion between the detection electrode portion S1 and the detection electrode portion S2.

Figure 5A:
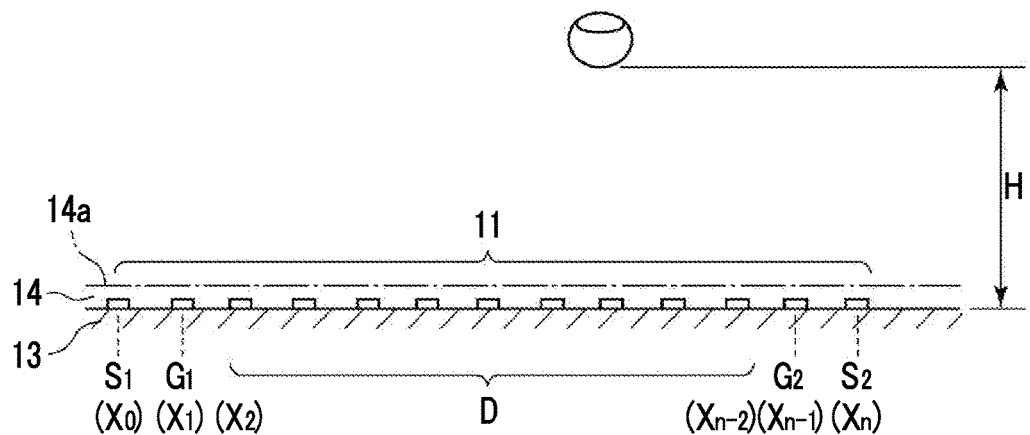
FIGS. 5A, 5B, and 5C are illustrative diagrams illustrating a switching operation of a driving electrode portion and a detection electrode portion according to approach of an operation body.
Figure 5B:
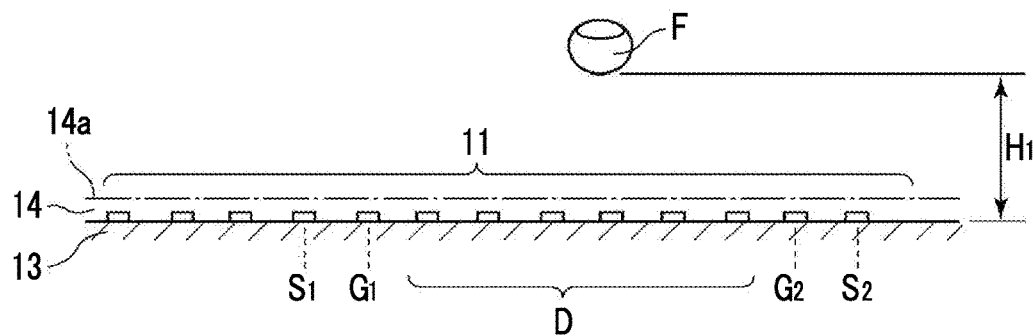

Therefore, the control unit 18 performs control for switching the setting of the electrode portions to narrow the interval in the X direction between the detection electrode portion S1 and the detection electrode portion S2 when the vertical distance H is shorter than an "approach detection distance" that is a threshold set in advance. For example, when a facing position in the X direction of the finger F is in a position illustrated in FIG. 5A and the vertical distance H to the finger F is determined to be shorter than the "approach detection distance," the multiplexer 15 is controlled. Also, new electrode portions are set to the detection electrode portions S1 and S2, as illustrated in FIG. 5B. These detection electrode portions S1 and S2 are set to have a shorter interval than that in the initial mode illustrated in FIG. 5A and to be arranged at substantially the same distance on both sides in the X direction with respect to the coordinate position that the finger F faces. According to switching of the detection electrode portions S1 and S2, the electrode portions located on the inner side of the new detection electrode portions S1 and S2 are set to the ground electrode portions G1 and G2, and the plurality of electrode portions located between the ground electrode portion G1 and the ground electrode portion G2 are set to the driving electrode portions D.

Further, in FIG. 5B, electrode portions other than the electrode portions newly set to the driving electrode portions D or the detection electrode portions S1 and S2, such as electrode portions arranged on the left side relative to the detection electrode portion S1, are all set to a ground potential.

Thus, when the finger F approaches the operation surface 14a, the output sum (Os1+Os2) increases as the finger F approaches the operation surface 14a due to the narrowed interval between the detection electrode portions S1 and S2 even when the vertical distance H of the finger F is 20 mm or less or 5 mm or less. Thus, the vertical distance H can be accurately measured based on the output sum (Os1+Os2) while the finger F approaches a position in which the finger F substantially comes in contact with the operation surface 14a.

A switching operation for narrowing the facing interval in the X direction between the detection electrode portions S1 and S2 may be performed only once when the vertical distance H is shorter than the "approach detection distance" determined in advance, or switching control of narrowing the facing interval in the X direction between the detection electrode portions S1 and S2 as the vertical distance H is shortened may be performed in a plurality of steps.

Figure 5C:
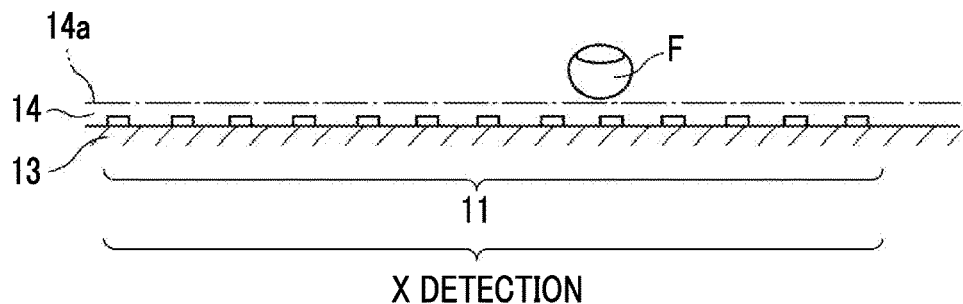

Further, while each of the detection electrode portions S1 and S2 and the ground electrode portions G1 and G2 is set as one electrode portion in the embodiment illustrated in FIGS. 3 and 5, each of the detection electrode portions S1 and S2 and the ground electrode portions G1 and G2 may be set as a plurality of adjacent electrode portions.

In FIGS. 3 and 4, the electrode portions $X_0$, $X_1$, $X_2$, $X_3$, ..., $X_n$ constituting the first electrode group 11 are set to the detection electrode portions S1 and S2, the ground electrode portions G1 and G2, and the driving electrode portions D, whereas in this setting, the electrode portions $Y_0$, $Y_1$, $Y_2$, $Y_3$, ..., $Y_n$ constituting the second electrode group 12 are all set to a ground potential.

In the hover detection mode, the first electrode group 11 and the second electrode group 12 are alternately driven in time division. That is, the detection electrode portions S1 and S2, the ground electrode portions G1 and G2, and the driving electrode portions D are set in the first electrode group 11 as illustrated in FIG. 3, and then, the detection electrode portions S1 and S2, the ground electrode portions G1 and G2, and the driving electrode portions D are set in the electrode portions $Y_0$, $Y_1$, $Y_2$, $Y_3$, ..., $Y_n$ of the second electrode group 12. In this case, all the electrode portions $X_0$, $X_1$, $X_2$, $X_3$, ..., $X_n$ constituting the first electrode group 11 are set to the ground potential. The setting of the first electrode group 11 and the setting of the second electrode group 12 are alternately repeated.

When the detection electrode portions S1 and S2, the ground electrode portions G1 and G2, and the driving electrode portions D are set in the first electrode group 11, and when the detection electrode portions S1 and S2, the ground electrode portions G1 and G2, and the driving electrode portions D are set in the second electrode group 12, an output difference (Os1−Os2) and an output sum (Os1+Os2) are calculated. A facing position of the finger F can be identified on an X-Y coordinate based on the output difference (Os1−Os2) obtained from each of the first electrode group 11 and the second electrode group 12. Further, the vertical distance H of the finger F is calculated by calculating an average value of the output sums (Os1+Os2) obtained from the first electrode group 11 and the second electrode group 12.

Touch Detection Mode

The vertical distance H of the finger F can be detected by setting the initial mode, but in the control unit 18, the touch detection mode is set when the vertical distance H is determined to be shorter than a "shortest detection distance" that is a threshold set in advance. The shortest approach distance is set to, for example, 5 mm or less or 2 mm or less. Alternatively, the touch detection mode is set after the finger F comes in contact with the operation surface 14a.

The touch detection mode is the same as an operation of a normal touch panel, and a contact position of the finger F is measured using a mutual capacitance detection scheme or a self-capacitance detection scheme.

In the capacitive input device 10, capacitance is formed between the electrode portions $X_0$, $X_1$, $X_2$, $X_3$, ..., $X_n$ constituting the first electrode group 11 and the electrode portions $Y_0$, $Y_1$, $Y_2$, $Y_3$, ..., $Y_n$ constituting the second electrode group 12.

In the mutual capacitance detection scheme, one of the first electrode group 11 of the plurality of electrode portions and the second electrode group 12 of the plurality of electrode portions is used as the driving electrode, and a voltage of a square wave is sequentially applied to the electrode portions that are the driving electrodes at a constant period. The electrode portions constituting the other electrode group are used as detection electrodes, and current flows through the detection electrodes at rising and falling timing of the square wave. In this case, an amount of current is determined by the capacitance between the electrode portions. When the finger F approaches or comes in contact with the operation surface 14a, large capacitance is formed between the finger F and the electrode portion, and thus, the current flowing through the detection electrodes changes when a voltage is applied to the driving electrodes. The control unit 18 can identify a coordinate position of the operation surface 14a that the finger F approaches or comes in contact with based on information on the electrode portion to which the voltage is applied and the detected amount of current.

Further, in the self-capacitance detection scheme, the electrode portions $X_0, X_1, X_2, X_3, \ldots, X_n$ constituting the first electrode group 11 and the electrode portions $Y_0, Y_1, Y_2, Y_3, \ldots, Y_n$ constituting the second electrode group 12 operate with functions of both the driving electrodes and the detection electrodes.

A Series of Input Operations

Next, a series of operations of the capacitive input device 10 together with an operation of the display input device 1 illustrated in FIG. 1 will be described. In a flowchart illustrated in FIG. 6, each operation step is denoted with a reference sign "ST."

When a power is supplied to the display input device 1, an initial menu screen or the like is displayed on a screen of the display device 3 such that the screen can be viewed through the capacitive input device 10 with a light transmission characteristic. Simultaneously, when the power is supplied to the capacitive input device 10, an initial mode is set as illustrated in ST1 of FIG. 6. In the initial mode, the electrode portions $X_0$ and $X_n$ on both right and left ends of the first electrode group 11 are set to detection electrode portions S1 and S2, the electrode portions $X_1$ and $X_{n-1}$ on the inner side are set to ground electrode portions G1 and G2, and all the electrode portions $X_2$ to $X_{n-2}$ on the inner side are set to a driving electrode portion D, as illustrated in FIGS. 3 and 5A. Further, the detection electrode portions S1 and S2, the ground electrode portions G1 and G2, and the driving electrode portion D are similarly set in the second electrode group 12.

When the first electrode group 11 is set as described above, all the electrode portions of the second electrode group 12 are set to a ground potential, and when the second electrode group 12 is set as described above, all the electrode portions of the first electrode group 11 are set to the ground potential. In the initial setting mode, the detection electrode portions S1 and S2, the ground electrode portions G1 and G2, and the driving electrode portion D are alternately set in the first electrode group 11 and the second electrode group 12.

The detection output Os1 from the detection electrode portion S1 and the detection output Os2 from the detection electrode portion S2 are applied from the detection circuit 17 to the control unit 18, and the output difference (Os1−Os2) and the output sum (Os1+Os2) are obtained by the control unit 18.

Figure 6:
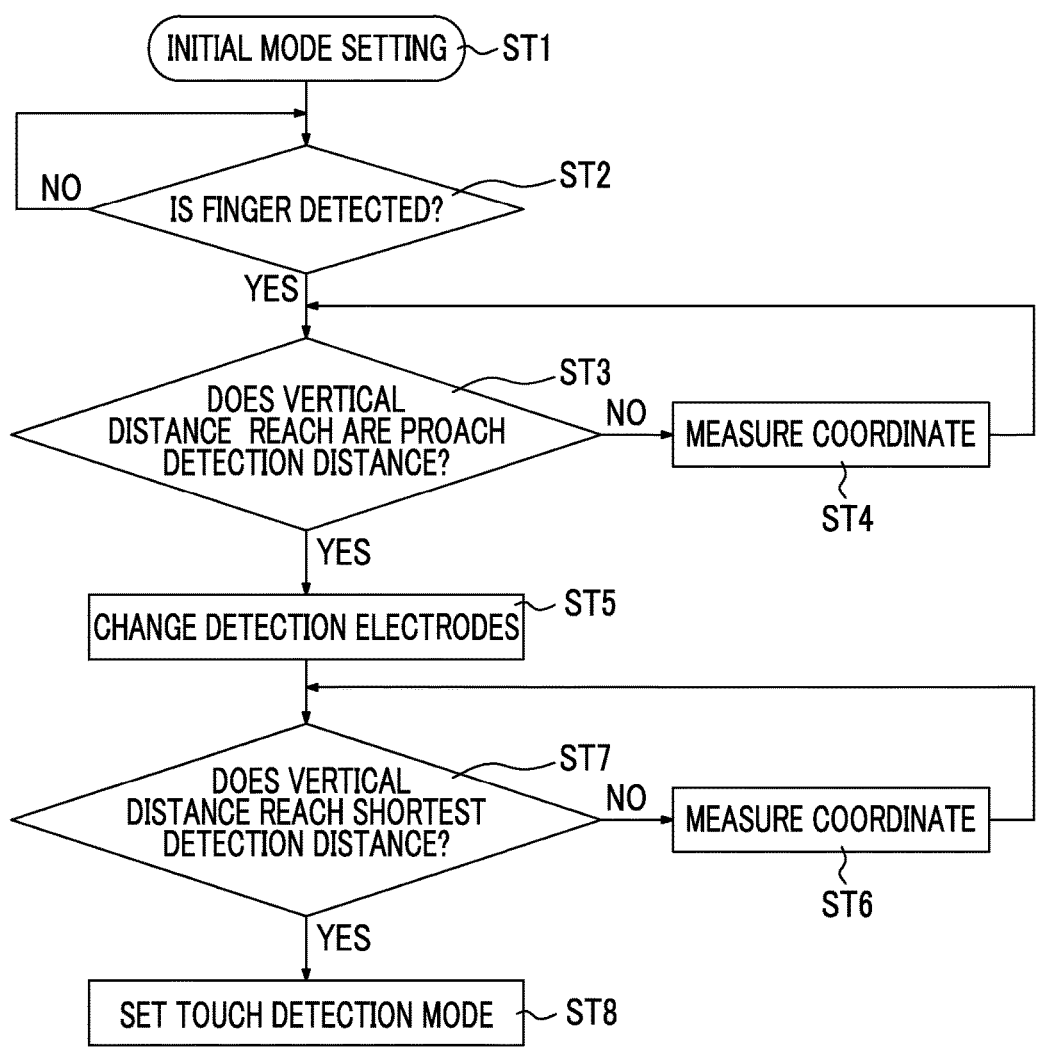
FIG. 6 is a flowchart of a detection operation.

The hover detection mode is set in ST1 to ST7 illustrated in FIG. 6.

In ST2 illustrated in FIG. 6, it is monitored whether the finger F approaches the front of the operation surface 14a. For example, this is performed by monitoring whether the output sum (Os1+Os2) has been changed by a predetermined value or greater. When it is determined in ST2 that the finger F approaches, the vertical distance H from the substrate 13 to the finger F is calculated based on the value of the output sum (Os1+Os2).

When it is determined in ST2 that the finger F approaches, the control unit 18 calculates the output difference (Os1−Os2). In ST4, a position of an X-Y coordinate in which the finger F faces the operation surface 14a is measured based on the output difference.

For example, a table or a calculation equation for distance calculation is held in the control unit 18, and the output sum (Os1+Os2) is applied to the table or the calculation equation to obtain the vertical distance H. Similarly, a table or a calculation equation for position calculation is held in the control unit 18, and the output difference (Os1−Os2) is applied to the table or the calculation equation to obtain the X-Y coordinate. The table or the calculation equation for distance calculation is determined based on a characteristic illustrated in FIG. 4B, and the table or the calculation equation for coordinate calculation is determined based on the characteristic illustrated in FIG. 4A.

Since a relationship between the output sum (Os1+Os2) and the vertical distance H is changed depending on the coordinate position that the finger F faces as illustrated in FIG. 4B, a table or a calculation equation indicating a correlation between the output sum (Os1+Os2) and the vertical distance H is set to be changed depending on the coordinate position. Also, the coordinate position may be first obtained from the output difference (Os1−Os2), and the output sum (Os1+Os2) may be applied to a table or a calculation equation corresponding to the coordinate position to obtain the vertical distance H.

In ST3, it is monitored whether the calculated vertical distance H is shorter than an "approach detection distance" that is a first threshold set in advance. As illustrated in FIG. 4B, when the vertical distance H is greater than a certain value in the central portion of the X-Y coordinate, the output sum (Os1+Os2) is increased as the vertical distance H is shortened. However, a reversal phenomenon that the output sum (Os1+Os2) is decreased when the vertical distance H becomes smaller than the certain value occurs, and it cannot be identified whether the finger F approaches or moves away. Thus, the "approach detection distance" that is the first threshold is set to a position slightly farther than a position in which the output sum is reversed. For example, in the example of FIG. 4B, the "approach detection distance" is set to 20 mm.

When it is determined in ST3 that the vertical distance H is shorter than the "approach detection distance", the process proceeds to ST5 and the setting of the detection electrode is changed by the control unit 18. When the vertical distance is a value H1 shorter than "approach detection distance" as illustrated in FIG. 5B, the multiplexer 15 is controlled by the control unit 18, and the electrode portions are switched so that a facing distance of the detection electrode portions S1 and S2 is shortened. In this case, since the facing coordinate position of the finger F is recognized from the output difference (Os1−Os2), the detection electrode portions S1 and S2 are switched to be arranged at a substantially equal distance on both sides in the X direction and on both sides in the Y direction with respect to the facing position of the finger F. Accordingly, the distance between the ground electrode portions G1 and G2 is also narrowed.

When the distance between the detection electrode portions S1 and S2 is narrowed, a reverse phenomenon of the output sum (Os1+Os2) as illustrated in FIG. 4B is removed, and the output sum (Os1+Os2) is increased as the vertical distance H1 is shortened. Even after the new detection electrode portions S1 and S2 are set, an output difference (Os1−Os2) is calculated and the facing position of the finger F is continuously measured as a position on the X-Y coordinate in ST6.

The facing position of the finger F on the X-Y coordinate and the vertical distances H and H1 of the finger F are applied from the control unit 18 to the main control unit of the display input device 1, and display content of the display device 3 is controlled by the main control unit.

For example, when the finger F is moved in the X-Y direction in a position away from the operation surface 14a, menu display displayed in the position that the finger F faces, which is a movement destination, is highlighted and selected. When any one menu is highlighted and the finger F approaches this menu display, the menu display is enlarged or display switching such as appearance of a new menu is performed. Further, control such as start-up of software corresponding to a menu selected by a small movement of the finger is performed.

In ST7, it is determined whether the vertical distance H1 calculated from the output sum (Os1+Os2) is smaller than a "shortest detection distance" that is a second threshold set in advance. The "shortest detection distance" that is the second threshold is set so that the distance from the operation surface 14a to the front is 5 mm or less, or 2 mm. Alternatively, the distance from the operation surface 14a being 0 is set to the "shortest detection distance."

If it is determined that the vertical distance reaches the "shortest detection distance", the process proceeds to ST8 and the capacitive input device 10 is set to the touch detection mode.

As described above, in the touch detection mode, all of the electrode portions $X_0$ to $X_n$ in the first electrode group 11 and the electrode portions $Y_0$ to $Y_n$ in the second electrode group 12 are used as electrodes for coordinate detection, driving power is sequentially supplied to the electrode portions in the one electrode group, and the detection output is obtained from the electrode portions of the other electrode group.

In the touch detection mode, when the finger F comes in contact with a menu display displayed on the display screen, control such as start-up of software corresponding to the menu display is performed. In ST5, switching is performed to narrow the distance between the detection electrode portions S1 and S2. Accordingly, the vertical distance of the finger F can be detected with high precision until the finger F further approaches the operation surface 14a, and mode switching can be smoothly performed so that the mode is switched to the touch detection mode if the finger F further approaches the operation surface 14a.

It should be understood by those skilled in the art that various modifications, combinations, sub-combinations and alterations may occur depending on design requirements and other factors insofar as they are within the scope of the appended claims of the equivalents thereof.

What is claimed is:

1. A capacitive input device comprising:
a first electrode group including a plurality of electrodes arranged at intervals in a first direction and extending in a second direction orthogonal to the first direction;
a controller configured to select, from among the plurality of electrodes:
at least one electrode to be set as at least one first detection electrode, the at least one first detection electrode being located at an end of the plurality of electrodes in the first direction in an initial mode;
at least one electrode to be set as at least one second detection electrode such that there is no other detection electrodes between the at least one first detection electrodes and the at least one second detection electrode, the at least one second detection electrode being located at another end of the plurality of electrodes in the first direction in the initial mode;
at least two electrodes between the at least one first detection electrode and the at least one second detection electrode to be set as driving electrodes;
at least one electrode between the at least one first detection electrode and the driving electrodes to be set to a ground potential so as to operate as at least one first ground electrode; and
at least one electrode between the at least one second detection electrode and the driving electrodes to be set to the ground potential so as to operate as at least one second ground electrode;
a driving circuit configured to supply driving power to the driving electrodes set by the controller; and
a detection circuit configured to detect outputs from the at least one first detection electrode and the at least one second detection electrode set by the controller,
wherein all of the electrodes between the at least one first ground electrode and the at least one second ground electrode are set as the driving electrodes, thereby an electric field is formed by the driving power,
wherein the controller is further configured:
to determine a position in the first direction of an operation body approaching the first electrode group based on a difference or a ratio between the outputs of the at least one first detection electrode and the at least one second detection electrode;
to determine a vertical distance of the operation body from the first electrode group based on a sum of the outputs of the at least one first detection electrode and the at least one second detection electrode;
to change setting of at least one of the at least one first detection electrode and the at least one second detection electrode from the initial setting based on the vertical distance of the operation body, such that a number of the driving electrodes provided between the at least one first detection electrode and the at least one second detection electrode is reduced and a distance between the at least one first detection electrode and the at least one second detection electrode in the first direction is shortened, if the vertical distance of the operation body from the first electrode group is shorter than a predetermined approach detection distance; and
to maintain the settings of the at least one first detection electrode and the at least one second detection electrode unless the vertical distance of the operation body from the first electrode group becomes shorter than the predetermined approach detection distance.

2. The capacitive input device according to claim 1, wherein the capacitive input device further comprises a display screen, and the controller is further configured to change contents of the display screen according to the distance.

3. The capacitive input device according to claim 2, wherein the capacitive input device further comprises a substrate with a light transmission characteristic provided in front of the display screen, and the first electrode group is provided on the substrate.

4. The capacitive input device according to claim 1, further comprising:
a second electrode group including a plurality of electrodes arranged at intervals in the second direction and extending in the first direction, a capacitance being formed between the first electrode group and the second electrode group, wherein the controller is further configured to switch, when the vertical distance of the operation body from the first electrode group becomes shorter than a predetermined shortest detection distance, a driving mode of the driving circuit into a touch detection mode in which the driving circuit sequentially supplies the driving power to the plurality of electrodes in one of the first electrode group and the second electrode group, while the detection circuit detects outputs from the plurality of electrodes in the other of the first electrode group and the second electrode group.

5. The capacitive input device according to claim 4, wherein the controller is further configured, in the driving mode of the driving circuit, to set the second electrode group to the ground potential while the driving circuit supplies the driving power to the driving electrodes set in the first electrode group such that the detection circuit detects the outputs from the at least one first detection electrode and the at least one second detection electrode set in the first electrode group, and to set the first electrode group to the ground potential while the driving circuit supplies the driving power to driving electrodes set in the second electrode group such that the detection circuit detects the outputs from at least one first detection electrode and at least one second detection electrode set in the second electrode group.

6. The capacitive input device according to claim 1, wherein the controller is further configured to change the setting of the at least one first detection electrode and the at least one second detection electrode such that the at least one first detection electrode and the at least one second detection electrode are substantially the same distance from the position of the operation body.

\* \* \* \* \*